(12) United States Patent
Bhattacharyya

(10) Patent No.: US 7,273,784 B2
(45) Date of Patent: Sep. 25, 2007

(54) SCALABLE HIGH DENSITY NON-VOLATILE MEMORY CELLS IN A CONTACTLESS MEMORY ARRAY

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/435,421

(22) Filed: May 17, 2006

(65) Prior Publication Data

US 2006/0234393 A1    Oct. 19, 2006

Related U.S. Application Data

(62) Division of application No. 11/044,703, filed on Jan. 27, 2005, now Pat. No. 7,166,888.

(51) Int. Cl.
*H01L 21/336* (2006.01)
(52) U.S. Cl. .................................................... 438/259
(58) Field of Classification Search ................ 438/259, 438/261
See application file for complete search history.

(56) References Cited

U.S. PATENT DOCUMENTS

| | | | |
|---|---|---|---|
| 4,929,988 A | 5/1990 | Yoshikawa | |
| 5,338,953 A | 8/1994 | Wake | |
| 5,386,132 A | 1/1995 | Wong | |
| 5,467,305 A | 11/1995 | Bertin | |
| 5,943,267 A | 8/1999 | Sekariapuram et al. | |
| 6,794,764 B1 | 9/2004 | Kamal et al. | |
| 6,878,991 B1 | 4/2005 | Forbes | |
| 2003/0227048 A1 | 12/2003 | Kianian | |
| 2004/0121540 A1 | 6/2004 | Lin | |
| 2005/0224861 A1 | 10/2005 | Lee et al. | |
| 2005/0269626 A1 | 12/2005 | Forbes | |

OTHER PUBLICATIONS

Mitsu Koyanagi et al.; Metal Nano-Dot Memory for High Density Non-Volatile Memory Application; 2004; Department of Bioengineering and Robotics, Tohoku University.
Cheng-Yuan Hsu et al.; Split-Gate NAND Flash Memory at 120nm Technology Node Featuring Fast Programming and Erase; 2004; VLSI Technical Digest; pp. 78-79.
F. Ito et al.,; A Novel MNOS Technology Using Gate Hole Injection in Erase Operation for Embedded Nonvolatile Memory Applications; 2004; VLSI Technical Digest; pp. 80-81.

(Continued)

*Primary Examiner*—Lex Malsawma
(74) *Attorney, Agent, or Firm*—Leffert Jay & Polglaze, P.A.

(57) ABSTRACT

A plurality of split gate non-volatile memory cells are formed vertically in a trench along the sidewalls. Each cell is comprised of a bistable element and an adjacent fixed gate threshold element that share a common respective control gate/access gate. The bistable element has a gate insulator stack that is comprised of either a floating gate or a charge trapping layer over a tunnel insulator. A plurality of silicon rich nitride layers are formed over the floating gate or charge trapping layer and separated by a high dielectric constant layer.

17 Claims, 7 Drawing Sheets

OTHER PUBLICATIONS

Meng-Yi Wu et al.,; Highly Scaliable Ballistic-injection *AND* (BiAND) Flash Memory; 2004; IEDM; To be published; Micro electronic Laboratory, Semiconductor Technology Application Research Group, Department of Electrical Engineering, National Tsing-Hua University.

T. Terano et al.,; Narrow Distribution of Threshold Voltages in 4Mbit MONOS Memory-Cell Arrays and its Impact on Cell Operation; IEDM; 2001; pp. 45-48.

Dana Lee et.,; Vertical floating-gate $4.5F^2$ Split-gate NOR Flash Memory at 110nm Node; VLSI Technical Digest; 2004; pp. 72-73.

Hiroshi Kotaki,; 70nm High-Performance 2 bit/cell Nonvolatile Memory with Oxide/Nitride/Oxide Sidewans; IEDM; 2003;To be published; Corporate Research and Development Group Integrated Circuits Group, Sharp Corporation.

D.J. DiMaria et al.,; Charge transport and trapping phenomena in off-stoichiometric silicon dioxide films; JAP; vol. 54; #10; pp. 5801-5827; 1983.

T. Ishimaru et al.,; Impact of SiON on Embedded Nonvolatile MNOS Memory; IEDM, to be published, 2004, Central Research Laboratory, Hitachi Ltd.

C. Hyun Lee et al.; A Novel SONOS Structure of $SiO_2/SiN/Al_2O_3$ with TaN metal gate for multi-giga bit flash memories; Samsung Electronics Co. LTD Semiconductor R&D Center; IEDM 2003; pp. 26.5.1-26.5.4.

P. Blomme et al.; Data retention of floating gate Flash memory with $SiO_2$/high-k tunnel or interpoly dielectric stack; IEDM 2004; Infineon Technologies.

C.C. Yeh et al.; A Novel Combo Flash Memory Using 0.13 μm Nbit[tm] Technology to Intergrate Code and Data Flash Memory in One Die; IEDM 2004; Technology Development Center, Macronix International Co.

T. Endoh et al.; Novel Ultra High Density Flash Memory with a Stacked-Surrounding Gate Transistor (S-SGT) Structured Cell; The Research Institute of Electrical Communication, TOHOKU University, Sendai, Japan; 2001; pp. 2.3.1-2.3.4.

R. Young et al.; A 110nm NOR Flash with Vertical-channel and Split-gate Architecture; IEDM 2004; PowerChip Semiconductor Corporation, Hsin-Chu, Taiwan.

SCALABLE HIGH DENSITY NON-VOLATILE MEMORY CELLS IN A CONTACTLESS MEMORY ARRAY

CROSS-REFERENCE TO RELATED APPLICATION

This is a Divisional Application of application Ser. No. 11/044,703, titled, "SCALABLE HIGH DENSITY NON-VOLATILE MEMORY CELLS IN A CONTACTLESS MEMORY ARRAY," filed Jan. 27, 2005 now U.S. Pat. No. 7,166,888, which application is assigned to the assignee of the present invention and the entire contents of which are incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), synchronous dynamic random access memory (SDRAM), dynamic random access memory (DRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As computers become smaller and their performance increases, the computer memories have also gone through a corresponding size reduction and performance increase. However, flash memory devices present a challenge in scalability due, at least in part, to the high programming voltages typically required.

Additionally, the negative voltages required for erasing a flash memory can cause problems with scalability. These types of voltages require additional components for isolating the negative voltage and diodes to protect circuits from leakage. These components, in addition to the contact required for access to the circuits, require additional real estate on the integrated circuit die. This reduces the amount of real estate available for memory cells.

For the reasons stated above, and for other reasons stated below which will become apparent to those skilled in the art upon reading and understanding the present specification, there is a need in the art for a more scalable, high performance non-volatile memory device.

DETAILED DESCRIPTION

Figure 1:
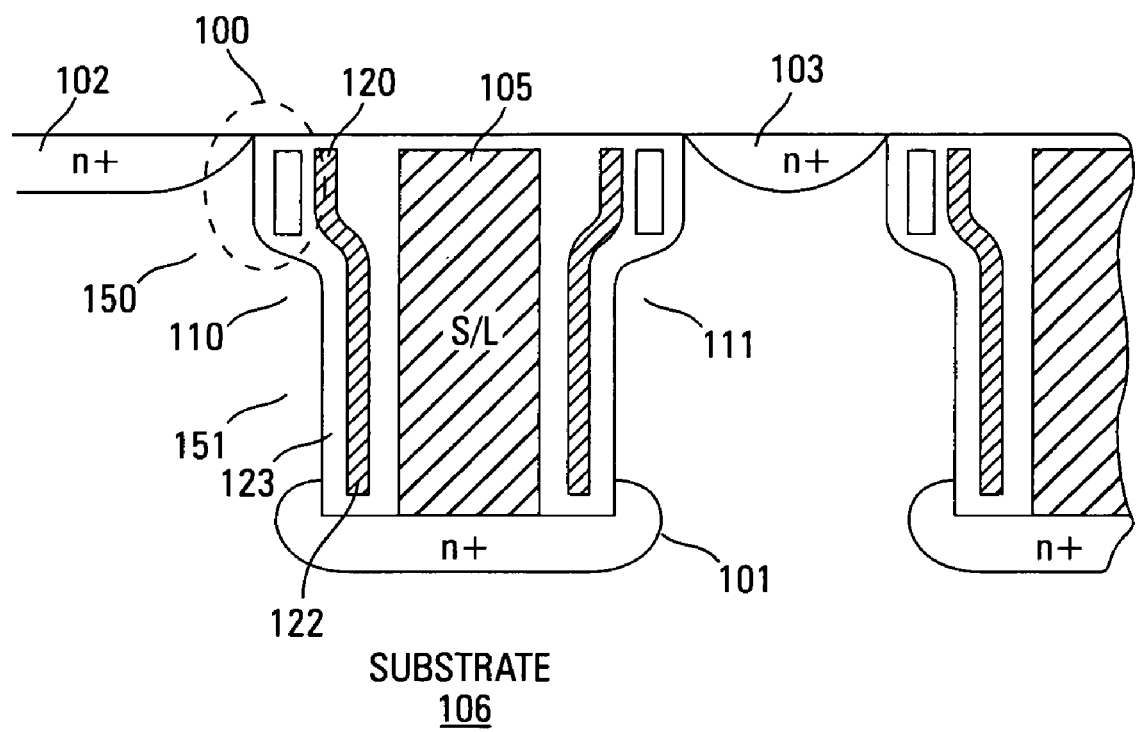
FIG. 1 shows a cross-sectional view of one embodiment of a two element non-volatile memory cell of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates a cross-sectional view of one embodiment of two element, split gate non-volatile memory cells of the present invention. Each cell is comprised of a bistable element 150 and a fixed threshold logic element 151 formed in a substrate trench. Even though there are two bistable elements and two fixed threshold logic elements formed in each trench, for purposes of clarity, only one side of the trench will be described as the opposing sidewall is substantially similar.

The trenches, in one embodiment, are narrower at the bottom and wider at the top. The wider section is the location of the bistable elements and the fixed threshold elements are formed along the sidewalls of the narrower section.

Each fixed threshold logic element 151 is comprised of an access gate 122 formed over the substrate 106. In one embodiment, this gate 122 is comprised of a polysilicon material that is formed as a single layer with the control gate 120 of the bistable element. An oxide material 123 separates the access gate 122 from the substrate 106 and the shared source line 105 that is formed substantially in the middle of the trench.

The bistable elements are comprised of a gate insulator stack 100 formed between the control gate 120 and the substrate 106 sidewall. Two embodiments for the gate insulator stack 100 are illustrated subsequently in FIGS. 2 and 3.

The control gate 120 for the bistable elements is formed as the single layer with the access gate 122 of the fixed threshold element. However, the control gate portion 120 of the single layer gate is formed down into the wider section of the trench thus keeping approximately an equal distance to the gate insulator stack as the distance between the access gate and the substrate sidewall of the fixed threshold element.

The non-volatile memory cell is further comprised of doped diffusion areas 101-103 in the substrate 106. In one embodiment, the substrate is a p-type material so that the doped areas 101-103 are n+ conductivity. However, an alternate embodiment could use an n-type substrate thus requiring p-type doped areas 101-103.

The lower doped area 101 is formed in the substrate below the trench. This area is contact-less and serves to serially link the two non-volatile memory cells in the trench.

The upper doped areas 102 and 103 are formed in the tops of the mesas between the trenches. These areas 102 and 103 are linking diffusion areas that serially link the non-volatile cells in each trench. This forms a NAND memory structure such as the serial columns illustrated in FIG. 7 and discussed subsequently.

Channel regions 110 and 111 are formed in the substrate 106 between the lower doped area 101 and the upper doped areas 102 and 103 respectively. These are the regions 110 and 111 in which the channels form, as is well known in the art, during operation of each memory cell. Since the channels are linked by the lower doped area 101, this can be referred to as a split channel 110 and 111.

The non-volatile memory cells are dual threshold devices. The fixed threshold element has a different threshold voltage than the bistable element. Thus, the two different elements turn on at different voltages. This architecture provides over erasure protection as well as other benefits.

Figure 2:
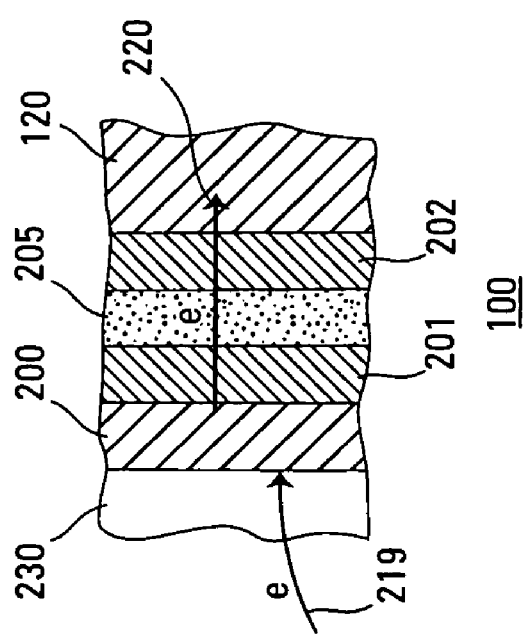
FIG. 2 shows a cross-sectional view of one embodiment of a floating gate insulator stack of the present invention.

FIG. 2 illustrates a cross-sectional view of one embodiment of a gate insulator stack 100 for a bi-stable element of the present invention, as discussed above with reference to FIG. 1. This architecture employs a floating gate for storing a charge. In one embodiment, the gate insulator stack can be used for storing multiple bits of data.

The stack 100 is comprised of a floating gate layer 200 that is formed over the tunnel insulator 230. The tunnel insulator 230 can be an oxide material, an oxy-nitride (ON) material such as SiON, or some other type of insulator. The floating gate 200 may be comprised of a silicon material or some other charge retention material. The SiON provides good back-tunneling characteristics in order to prevent a charge from leaking back to the substrate. The tunnel insulator layer 230 is a common element between the bistable element and the fixed threshold element of the present invention.

The gate insulator stack 100 is further comprised of a high-K dielectric layer 205 (e.g., $Al_2O_3$, $HfO_2$, $ZrO_2$, or $PrO_3$) that is formed between two layers 201 and 202 of injector silicon rich nitride (SRN). These layers enhance the erase speed of the non-volatile memory cell as well as reduce the erase voltage required for the erase operation. During the erase operation, the electrons are removed 220 from the floating gate 200 to the control gate (i.e., positive potential) by enhanced Fowler-Nordheim tunneling.

For programming 219, tunneling or the more efficient source-side injection can be employed so that the higher source potential efficiently couples to the floating gate while also capacitively boosting the control gate (which is also pulsed high).

The control gate 120 is formed over the gate insulator stack 100. This is the same control gate 120 as is illustrated in FIG. 1.

Figure 3:
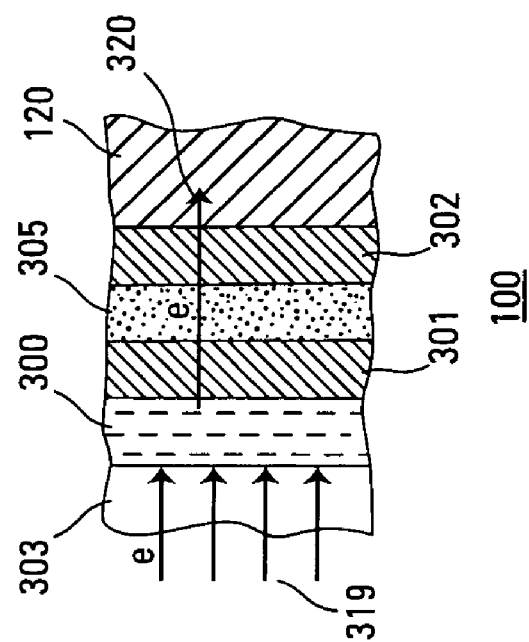
FIG. 3 shows a cross-sectional view of one embodiment of a trapping layer insulator stack of the present invention.

FIG. 3 illustrates a cross-sectional view of an alternate embodiment of a gate insulator stack 100 for a bi-stable element as illustrated in FIG. 1. This embodiment utilizes a trapping layer instead of the floating gate charge storage layer of FIG. 2. The stack architecture of this embodiment provides the capability of storing one or more bits per memory element in the trapping layer. This is accomplished by varying the trapping density of the trapping layer.

A tunnel insulator layer 303 is formed over the substrate. In one embodiment, the tunnel insulator 303 is formed from silicon oxynitride (SiON). The SiON provides good back-tunneling characteristics in order to prevent a charge from leaking back to the substrate. Alternate embodiments may use other materials such as another oxynitride material or an oxide material. As discussed subsequently, the tunnel insulator 303 is a common element between the bistable element and the fixed threshold element of the present invention.

The tunnel insulator 303 can be formed over the substrate using an atomic layer deposition (ALD) technique to produce a thickness, in one embodiment, in the range of 2-5 nm, an effective oxide thickness (EOT) of 1-2.5 nm. The actual desired thickness depends on the power supply ($V_{DD}$) requirement. The 2-5 nm range is appropriate for a $V_{DD}$ of 1.0-2.5V. A thickness of less than 2.5 nm typically enables the element to operate in the direct tunneling regime. Alternate embodiments that use other power supply voltages would use different insulator thicknesses.

In one embodiment, an SiON tunnel insulator 101 is characterized to have a very low trap density of less than $1\times10^{11}$, an atomic concentration of nitrogen that is less than or equal to 20%, an atomic oxygen concentration of greater than or equal to 45%, and a refractive index of 1.55 to 1.65. These numbers are for purposes of illustration only.

A charge trapping layer 300 is formed over the tunnel insulator 303. The trapping layer 300 has a high trap density (e.g., $5\times10^{12}$ to $1\times10^{14}$). This layer 300 can be comprised of a high dielectric constant (high-K) material (e.g., $Al_2O_3$) with high-density metal nano-dots, dots, silicon nano-crystals, a silicon rich insulator, or $SiON/Si_3N_4$ having a refractive indices range of 1.75-2.0. A typical thickness range for the trapping layer 102 is 4-6 nm. However, alternate embodiments may have other thickness ranges.

The high-density metal nano-dots are embedded into a high dielectric constant insulator material. The embedded metal nano-dots are used as a charge retention layer for the non-volatile memory element. Each metal dot acts as an isolated, one-dimensional, small floating gate. Therefore, even if a charge leakage path exists between one small floating gate and the substrate or the control gate, the remaining nano-dots in the film layer retain the charge.

In one embodiment, the density range of the metal nano-dots in the trapping layer 300 is in the range of $5\times10^{12}$ to $10\times10^{13}$ with typical dot sizes in the range of 1-3 nm and spaced greater than 3 nm apart in the high-K dielectric material. Alternate embodiments can use different densities, dot sizes, and spacing.

The metal nano-dot elements can include platinum (Pt), gold (Au), Cobalt (Co), Tungsten (W) or some other metal that provides deep energy electron and hole traps. In one embodiment, the metal nano-dot layer is deposited by sputtering or evaporation at relatively low temperatures.

A high-K dielectric layer 305 is formed between two injector silicon rich nitride layers 301 and 302. These layers enhance erase speed and reduce the erase voltage required during an erase operation as the electrons are removed 320 from the trapping layer 300 to the control gate 120.

The control gate 120 is formed over the last SRN layer 302. The control gate 120 is illustrated in FIG. 1.

During programming, electrons are injected 319 from the substrate and stored in the trapping layer 303. During the programming operation, the control gate 120 is pulsed higher than the source line in order to facilitate electron transport from the vertical channel (110 of FIG. 1) to the floating trap layer 300.

Figure 4:
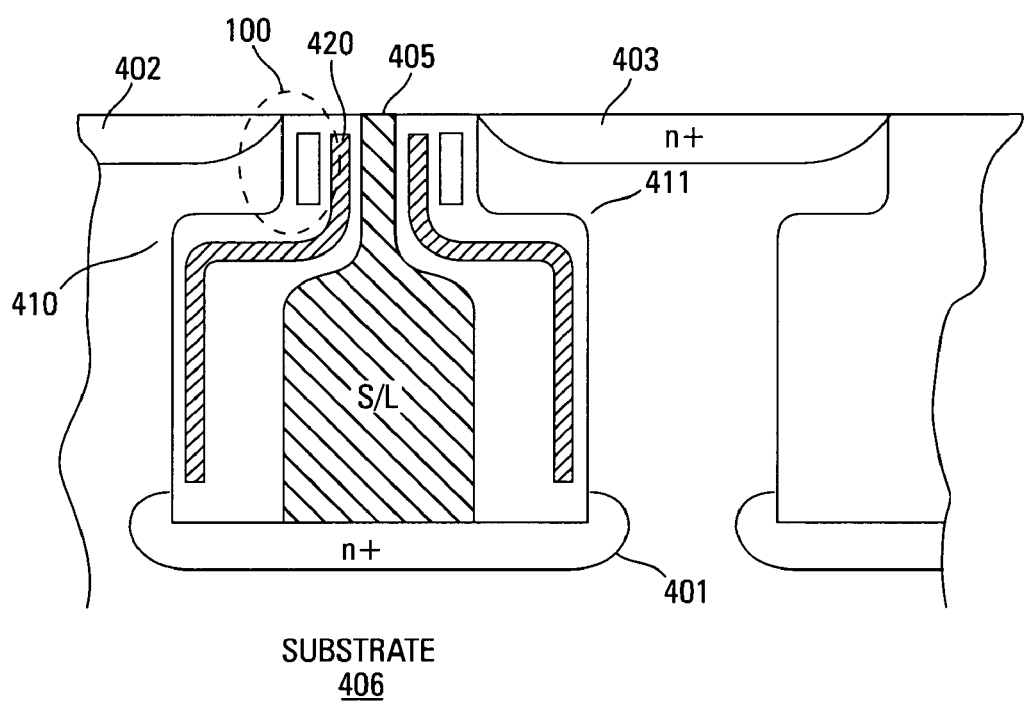
FIG. 4 shows a cross-sectional view of an alternate embodiment of a two element non-volatile memory cell of the present invention.

FIG. 4 illustrates another embodiment of two element, split gate non-volatile memory cells of the present invention. In this embodiment, the trench in which the cells are formed each sidewall has a narrower top section where the bistable elements are formed and a wider bottom section where the fixed threshold elements are formed.

This embodiment is comprised of the bistable and fixed threshold elements as illustrated in previous embodiments. The gate stack insulator 100 embodiments of FIGS. 3 and 4 can also be used, in addition to other gate stack insulator embodiments.

A shared source line 405 is formed substantially in the center of the trench. The control gates 420 for the bistable elements and the access gate for the fixed threshold elements are formed substantially parallel to the sidewalls as in the embodiment of FIG. 1.

The link diffusions 401-403 are doped into the substrate 406. The upper diffusions 402 and 403 that serially link each trench are formed at the top of the mesas. The lower diffusion 401 that serially links the elements within each trench is formed at the bottom of the trench.

Also as in the previous embodiments, the channels 410 and 411 form vertically in channel regions between the upper diffusion areas 402 and 403 and the lower diffusion area 401.

Figure 5:
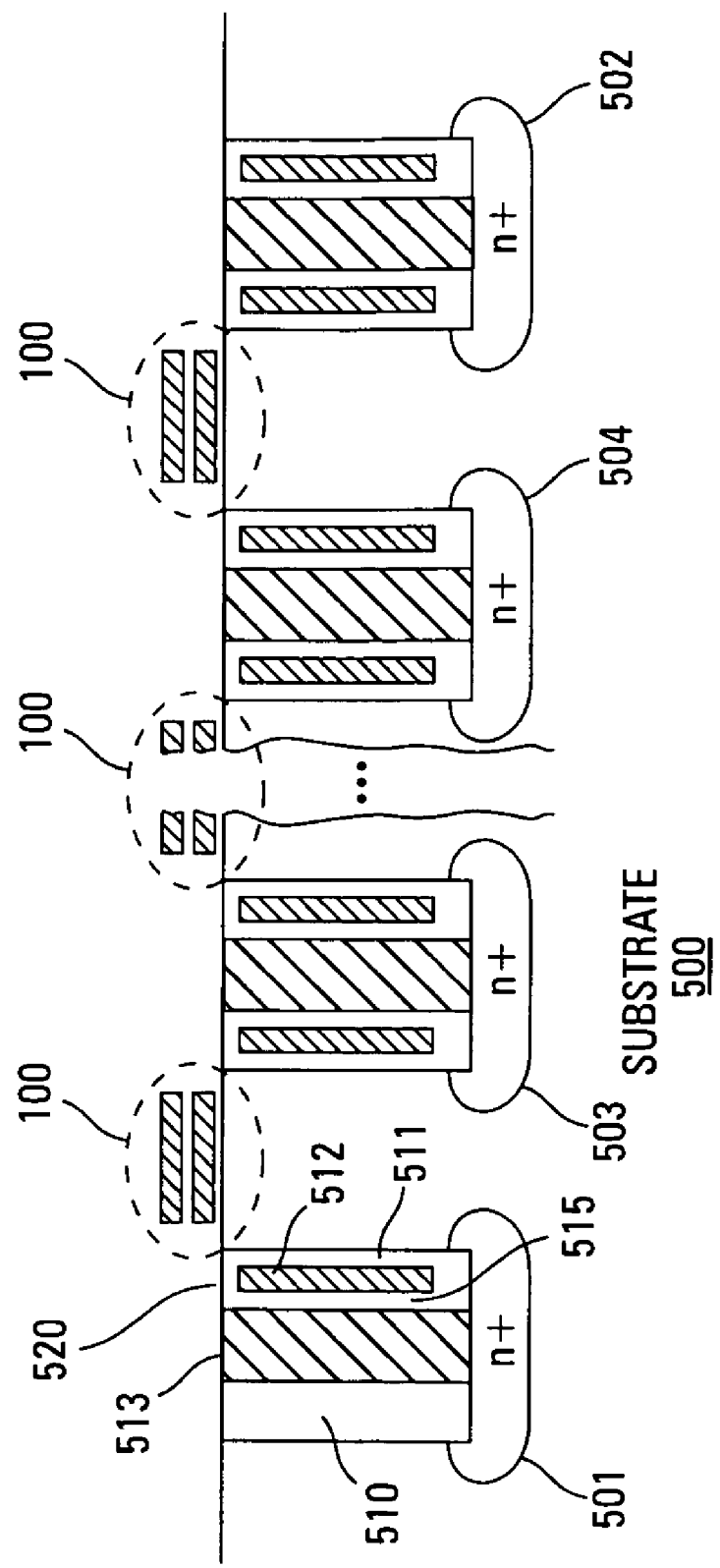
FIG. 5 shows a cross-sectional view of another embodiment of a two element non-volatile memory cell of the present invention.

FIG. 5 illustrates a cross-sectional view of another embodiment of a portion of a NAND memory cell string of two bit per cell device. This embodiment can also utilize the gate insulator stacks 100 of FIGS. 2 and 3 as well as other gate insulator stacks.

In this embodiment, the gate insulator stacks 100 for the bistable elements are formed on the mesas between the substrate 500 trenches. The fixed threshold select gate elements are formed within the trenches. These elements are each formed by a select gate 512 formed in a trench between an oxide material 510 and 511. A shared source line 513 is formed substantially in the middle of the trench with the oxide material 510 and 511 on either side.

The shared source lines 513 are coupled to diffusion areas 501-504 that are formed at the bottom of the trenches. As in previous embodiments, the diffusion areas shown 501-504 are n+ type areas in a p-type substrate. However, the present invention is not limited to this type of conductivity.

The vertical placement of the select elements 520 provides a low leakage device with minimal overhead especially when integrated with buried and shared source lines. This string of memory devices can be used to store one or two bits per cell.

For operation in the one bit per cell mode, one end diffusion region 501 or 502 is used as the shared source line and the other end diffusion region 502 or 501 is used as the shared bit line. For operation in the two bits per cell mode, the second bit can be accessed by switching the source and bit lines. In other words, during the first bit operation, the first end 501 is the shared source line and the other end 502 is the shared bit line. For accessing the second bit, the first end 501 is the shared bit line and the other end 502 is the shared source line.

Figure 6:
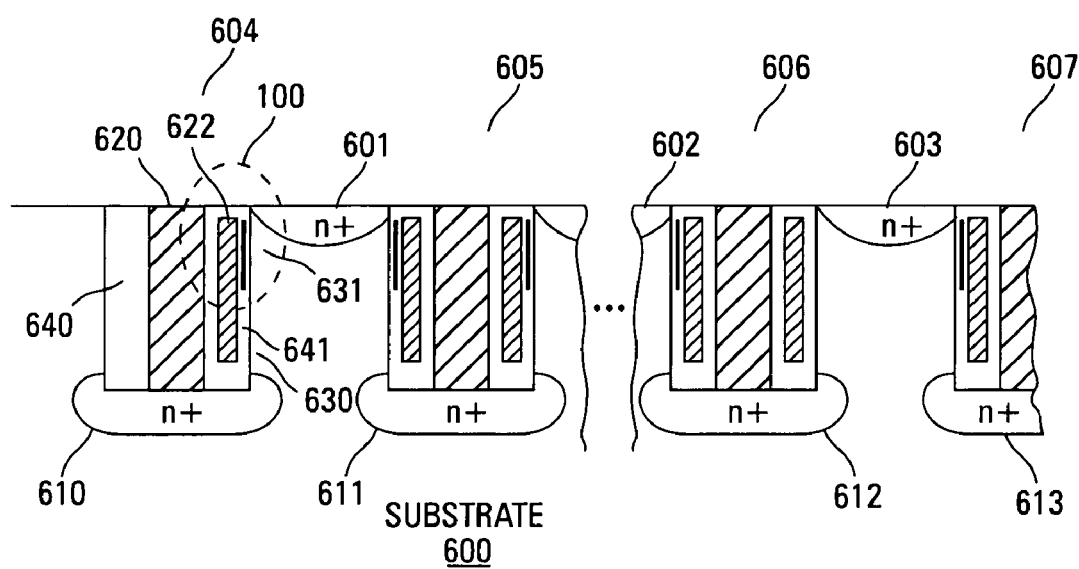
FIG. 6 shows a cross-sectional view of yet another embodiment of a two element non-volatile memory cell of the present invention.

FIG. 6 illustrates an embodiment in which multiple split gate elements are integrated inside the trench for both the floating gate as well as the embedded trap embodiments. The planar portion (i.e., top of the mesa) only carries a contactless n+ diffusion (for the NAND embodiment) as a link to the adjacent cell of the string. The embodiment of FIG. 6 would have a deeper trench and would yield a denser array than the other embodiments, at the expense of a more complex fabrication process.

In the embodiment of FIG. 6, the plurality of cells 604-607 are coupled serially by link diffusions 601-603 that are formed in the tops of the mesas. Shared source lines 610-613 are doped into the bottoms of the trenches as well as formed into the middle 620 of the trenches. The illustrated embodiment uses a p-type substrate 600 and n+ doped areas 601-603, 610-613. However, the present invention is not limited to any one conductivity type.

An oxide material is formed around the source line 620 in the trench. The control gate 622 for the bistable element 631 and the access gate 622 for the fixed threshold element 630 are formed as a single layer substantially parallel to each sidewall of the trench. As in previous embodiments, the embodiments of the gate insulator stacks 100 of the present invention are integrated into each of the bistable elements 631.

While the above-described embodiments are implemented in a NAND structure, the present invention is not limited to this type of array. For example, the present invention can operate in a NOR architecture, an AND architecture, a virtual gate array (VGA) architecture, or any other type of array architecture.

Figure 7:
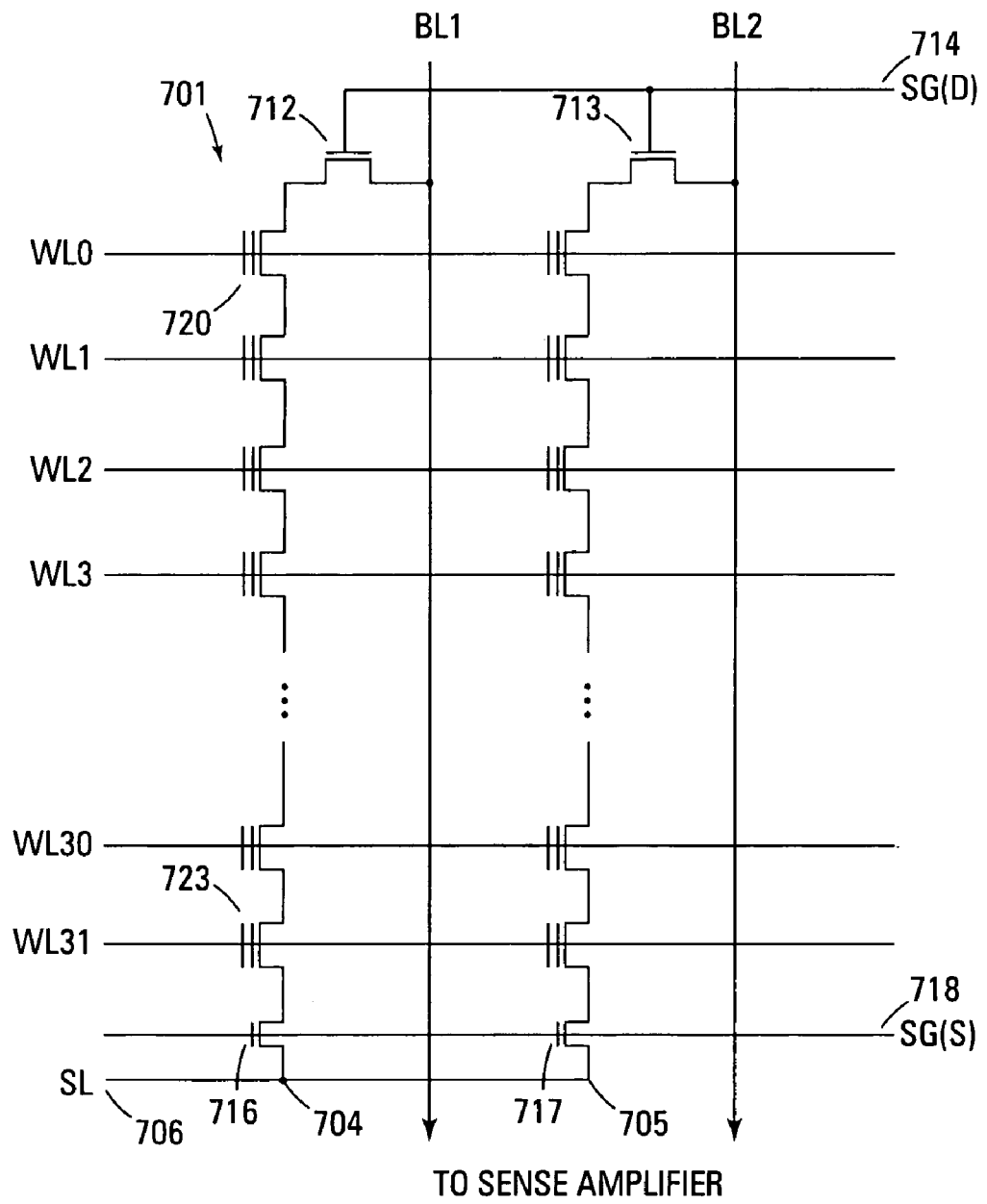
FIG. 7 shows a simplified diagram of one embodiment of a NAND flash memory array architecture of the present invention.

FIG. 7 illustrates a simplified diagram of one embodiment for a NAND flash memory array of the present invention. The memory array of FIG. 7, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 701 arranged in series strings 704, 705. Each of the floating gate cells 701 are coupled drain to source in each series chain 704, 705. A word line (WL0-WL31) that spans across multiple series strings 704, 705 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 704, 705 to be written to or read from and operate the remaining floating gate memory cells in each series string 704, 705 in a pass through mode. Each series string 704, 705 of floating gate memory cells is coupled to a source line 706 by a source select gate 716, 717 and to an individual bitline (BL1-BLN) by a drain select gate 712, 713. The source select gates 716, 717 are controlled by a source select gate control line SG(S) 718 coupled to their control gates. The drain select gates 712, 713 are controlled by a drain select gate control line SG(D) 714.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell.

For single bit cells, the $V_t$ window is larger than the $V_t$ for a multilevel cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. The quantity of voltage ranges required depends on the quantity of bits stored in the cell. Also, a dead space or guard band of 0.2V to 0.4V may be located between each voltage range. If the voltage detected on the cell is within the first range, the cell is storing a 00. If the voltage is within the second range, the cell is storing a 01. This continues for as many ranges that are used for the cell. These voltage ranges are for purposes of illustration only as the present invention is not limited to a certain quantity of voltage ranges, a voltage range, bit assignments, or guard band spacing.

During a typical prior art programming operation, the selected wordline for the flash memory cell to be programmed is biased with a programming pulse at a voltage that is greater than 16V. A verification operation with a wordline voltage of 0V is then performed to determine if the floating gate is at the proper voltage (e.g., 0.5V). The unselected wordlines for the remaining cells are typically biased at approximately 10V during the program operation. Each of the memory cells is programmed in a substantially similar fashion.

Figure 8:
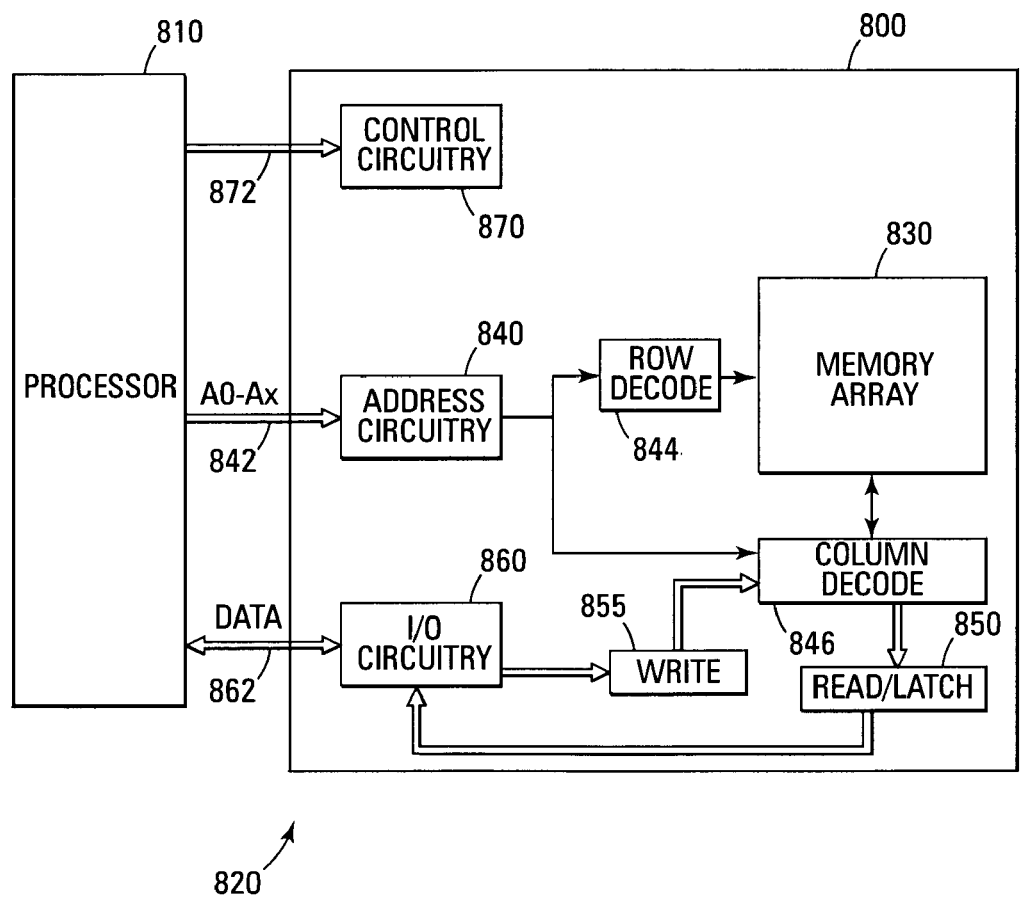
FIG. 8 shows a block diagram of one embodiment of an electronic system of the present invention.

FIG. 8 illustrates a functional block diagram of a memory device 800 that can incorporate the non-volatile memory cells of the present invention. The memory device 800 is coupled to a processor 810. The processor 810 may be a microprocessor or some other type of controlling circuitry. The memory device 800 and the processor 810 form part of an electronic system 820. The memory device 800 has been simplified to focus on features of the memory that are helpful in understanding the present invention.

The memory device includes an array of memory cells 830 that can be comprised of the multi-level non-volatile memory cells previously illustrated. The memory array 830 is arranged in banks of rows and columns. The gates of each row of memory cells are coupled with a wordline while the drain and source connections of the memory cells are coupled to bit lines.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write (program), and erase operations. The control circuitry 870 may be a state machine, a sequencer, or some other type of controller.

The memory device illustrated in FIG. 8 has been simplified to facilitate a basic understanding of the features of the memory. A more detailed understanding of internal circuitry and functions of memories are known to those skilled in the art.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating an integrated non-volatile memory device, the method comprising:

forming a plurality of trenches in a substrate material, each pair of trenches defining a mesa and each trench having a top section and a bottom section;

forming a bistable element along and adjacent to each sidewall of the trenches, the bistable element having a control gate;

forming a fixed threshold element along and adjacent to each sidewall of the trenches and adjacent to the bistable element, the fixed threshold element having an access gate formed as a single layer with the control gate;

forming diffusion areas in the tops of the mesas and in the substrate at the bottoms of the trenches; and forming a shared source line substantially in the middle of each trench.

2. The method of claim 1 wherein forming the bistable element further includes:

forming a tunnel insulator layer over the trench sidewall;

forming a floating gate layer over the tunnel oxide layer;

forming first silicon rich nitride layer over the floating gate layer;

forming a high dielectric constant insulator layer over the first silicon rich nitride layer;

forming a second silicon rich nitride layer over the high dielectric constant insulator layer; and forming the control gate layer over the second silicon rich nitride layer.

3. The method of claim 2 wherein the tunnel insulator layer is an oxide layer.

4. The method of claim 1 wherein forming the bistable element further includes:

forming a tunnel insulator layer over the trench sidewall;

forming a trapping layer over the tunnel oxide layer;

forming first silicon rich nitride layer over the trapping layer;

forming a high dielectric constant insulator layer over the first silicon rich nitride layer;

forming a second silicon rich nitride layer over the high dielectric constant insulator layer; and forming the control gate layer over the second silicon rich nitride layer.

5. The method of claim 1 wherein forming the plurality of trenches comprises forming the top section to be narrower than the bottom section.

6. The method of claim 1 wherein forming the plurality of trenches comprises forming the top section to be wider than the bottom section.

7. The method of claim 1 wherein the bistable element is formed in the top section and the fixed threshold element is formed in the bottom section.

8. A method for fabricating an integrated non-volatile memory device, the method comprising:
   forming a plurality of trenches in a substrate material, each pair of trenches defining a mesa;
   forming a planar bistable element on each mesa wherein each planar bistable element is comprised of a first insulator layer over each mesa, one of a trapping layer or a floating gate over the first insulator layer, a first silicon rich nitride layer over the trapping or floating gate, a second insulator layer over the first silicon rich nitride layer, a second silicon rich nitride layer over the second insulator layer, and a control gate over the second silicon rich nitride layer;
   forming a fixed threshold element along each sidewall of the trenches and substantially adjacent to the bistable element;
   forming a shared source line diffusion area in substrate at the bottom of each trench; and
   forming a shared source line substantially in the middle of each trench.

9. The method of claim 8 wherein forming the fixed threshold element comprises forming a select gate layer substantially parallel to the sidewall.

10. The method of claim 8 wherein the trapping layer comprises a high dielectric constant material having one of metal nano-dots or silicon nano-crystals.

11. The method of claim 10 wherein the metal nano-dots comprise one of: platinum (Pt), gold (Au), Cobalt (Co), or Tungsten (W).

12. The method of claim 10 wherein the metal nano-dots have a density in the range of $5\times10^{12}$ to $10\times10^{13}$, dot sizes in the range of 1-3 nm, and spaced greater than 3 nm.

13. A method for fabricating an integrated non-volatile memory integrated circuit, the method comprising:
   forming a plurality of mesas in a p-type substrate material, each pair of mesas defining a trench and each mesa having a top section and a bottom section;
   forming a bistable element at the top section along opposing sidewalls of each mesa, the bistable element having a control gate;
   forming a fixed threshold element along opposing sidewalls at the bottom section and adjacent to both the bistable element and the sidewall, the fixed threshold element having an access gate that is formed as a single layer common control gate with the control gate;
   doping n× diffusion areas in the top of each mesa between and substantially adjacent two bistable elements and in the substrate at the bottom of each trench; and
   forming a shared source line in each trench between each pair of mesas.

14. The method of claim 13 wherein the top section is formed narrower than the bottom section.

15. The method of claim 13 wherein forming the shared source line comprises forming a pillar in each trench that is coupled to the diffusion area at the bottom of the trench.

16. The method of claim 13 and further comprising forming an oxide material on either side of the shared source line between the source line and the mesa sidewalls.

17. The method of claim 13 wherein the single layer common control gate is comprised of polysilicon.

* * * * *

UNITED STATES PATENT AND TRADEMARK OFFICE
CERTIFICATE OF CORRECTION

| | | |
|---|---|---|
| PATENT NO. | : 7,273,784 B2 | |
| APPLICATION NO. | : 11/435421 | |
| DATED | : September 25, 2007 | |
| INVENTOR(S) | : Bhattacharyya | |

It is certified that error appears in the above-identified patent and that said Letters Patent is hereby corrected as shown below:

In column 10, line 21, in Claim 13, delete "nx" and insert -- n+ --, therefor.

Signed and Sealed this

Fourth Day of March, 2008

JON W. DUDAS
*Director of the United States Patent and Trademark Office*